United States Patent [19]
McBean, Sr.

[11] Patent Number: 5,724,557
[45] Date of Patent: Mar. 3, 1998

[54] METHOD FOR DESIGNING A SIGNAL DISTRIBUTION NETWORK

[75] Inventor: Ronald V. McBean, Sr., Gilbert, Ariz.

[73] Assignee: Motorola, Inc., Schaumburg, Ill.

[21] Appl. No.: 499,838

[22] Filed: Jul. 10, 1995

[51] Int. Cl.[6] .................................................. G06F 11/25
[52] U.S. Cl. ........................ 395/500; 364/488; 364/489
[58] Field of Search ........................ 395/500; 364/488–491

[56] References Cited

U.S. PATENT DOCUMENTS

| | | | |
|---|---|---|---|
| 4,263,651 | 4/1981 | Donath et al. | 364/300 |
| 5,077,676 | 12/1991 | Johnson et al. | 364/489 |
| 5,170,160 | 12/1992 | Cooperman et al. | 340/825.87 |
| 5,274,568 | 12/1993 | Blinne et al. | 364/489 |
| 5,293,626 | 3/1994 | Priest et al. | 395/550 |
| 5,339,253 | 8/1994 | Carrig et al. | 364/489 |
| 5,365,463 | 11/1994 | Donath et al. | 364/578 |
| 5,475,605 | 12/1995 | Lin | 364/488 |
| 5,475,607 | 12/1995 | Apte et al. | 364/489 |
| 5,508,937 | 4/1996 | Abato et al. | 364/488 |
| 5,544,071 | 8/1996 | Keren et al. | 364/489 |
| 5,583,787 | 12/1996 | Underwood et al. | 364/489 |
| 5,600,787 | 2/1997 | Underwood et al. | 395/183.06 |

*Primary Examiner*—Kevin J. Teska
*Assistant Examiner*—Matthew Loppnow
*Attorney, Agent, or Firm*—Rennie William Dover

[57] ABSTRACT

A computer implemented method (10) for designing a signal distribution architecture (40). The method includes developing a signal distribution network architecture model (11) and a delay model (12). The delay model (12) describes a temporal relationship of inputs and corresponding outputs of the signal distribution architecture model (40). The signal distribution network architecture (11) and delay (12) models are combined to form a master model (13). A set of values are inserted into the master model (13) to generate a response model (16). The response model (16) is used to select the signal distribution architecture (40).

20 Claims, 6 Drawing Sheets

| 3-LEVEL SYMMETRICAL MODEL | | | | | |
|---|---|---|---|---|---|
| | 1 | 2 | 3 | | X |
| LOADS | 27.00 | 64.00 | 125.00 | ... | $Y_0$ |
| FANOUT-LEVEL 1 DRIVER | 3.00 | 4.00 | 5.00 | ... | $Y_1$ |
| FANOUT-LEVEL 2 DRIVER | 3.00 | 4.00 | 5.00 | ... | $Y_2$ |
| FANOUT-LEVEL 3 DRIVER | 3.00 | 4.00 | 5.00 | ... | $Y_3$ |
| LEVEL 1 DRIVERS | 1.00 | 1.00 | 1.00 | ... | $Y_4$ |
| LEVEL 2 DRIVERS | 3.00 | 4.00 | 5.00 | ... | $Y_5$ |
| LEVEL 3 DRIVERS | 9.00 | 16.00 | 25.00 | ... | $Y_6$ |
| SUM-LEVEL 3 DRIVERS' LOADS | 27.00 | 64.00 | 125.00 | ... | $Y_7$ |
| SUM-LOADS | 39.00 | 84.00 | 84.00 | ... | |
| SUM-DRIVERS | 13.00 | 21.00 | 21.00 | ... | $\vdots$ |
| AVERAGE LOAD | 3.00 | 4.00 | 4.00 | ... | |
| RATIO-LEVEL 3 DRIVERS' LOADS/LOADS | 69.23 | 76.19 | 80.65 | ... | $Y_N$ |
| 4-LEVEL RULE 90 MODEL | | | | | |
| | 1 | 2 | 3 | | X |
| LOADS | 40.00 | 50.00 | 80.00 | ... | $Y_0$ |
| FANOUT-LEVEL 1 DRIVER | 1.00 | 1.00 | 1.00 | ... | $Y_1$ |
| FANOUT-LEVEL 2 DRIVER | 1.00 | 1.00 | 2.00 | ... | $Y_2$ |
| FANOUT-LEVEL 3 DRIVER | 5.00 | 5.00 | 5.00 | ... | $Y_3$ |
| FANOUT-LEVEL 4 DRIVER | 8.00 | 10.00 | 8.00 | ... | $Y_4$ |
| LEVEL 1 DRIVERS | 1.00 | 1.00 | 1.00 | ... | $Y_5$ |
| LEVEL 2 DRIVERS | 1.00 | 1.00 | 1.00 | ... | $Y_6$ |
| LEVEL 3 DRIVERS | 1.00 | 1.00 | 2.00 | ... | $Y_7$ |
| LEVEL 4 DRIVERS | 5.00 | 5.00 | 10.00 | ... | $Y_8$ |
| SUM-LEVEL 4 DRIVERS' LOADS | 40.00 | 50.00 | 80.00 | ... | $Y_9$ |
| SUM-LOADS | 47.00 | 57.00 | 93.00 | ... | |
| SUM-DRIVERS | 8.00 | 8.00 | 14.00 | ... | $\vdots$ |
| AVERAGE LOAD | 5.88 | 7.13 | 6.64 | ... | |
| RATIO-LEVEL 4 DRIVERS' LOADS/LOADS | 85.11 | 87.72 | 86.02 | ... | $Y_N$ |

| 4-LEVEL RULE 90 MODEL | | | | | |
|---|---|---|---|---|---|
| | 1 | 2 | 3 | ... | X |
| LOADS | 40.00 | 50.00 | 80.00 | ... | $Y_0$ |
| FANOUT-LEVEL 1 DRIVER | 1.00 | 1.00 | 1.00 | ... | $Y_1$ |
| FANOUT-LEVEL 2 DRIVER | 1.00 | 1.00 | 2.00 | ... | $Y_2$ |
| FANOUT-LEVEL 3 DRIVER | 5.00 | 5.00 | 5.00 | ... | $Y_3$ |
| FANOUT-LEVEL 4 DRIVER | 8.00 | 10.00 | 8.00 | ... | $Y_4$ |
| LEVEL 1 DRIVERS | 1.00 | 1.00 | 1.00 | ... | $Y_5$ |
| LEVEL 2 DRIVERS | 1.00 | 1.00 | 1.00 | ... | $Y_6$ |
| LEVEL 3 DRIVERS | 1.00 | 1.00 | 2.00 | ... | $Y_7$ |
| LEVEL 4 DRIVERS | 5.00 | 5.00 | 10.00 | ... | $Y_8$ |
| SUM-LEVEL 4 DRIVERS' LOADS | 40.00 | 50.00 | 80.00 | ... | $Y_9$ |
| SUM-LOADS | 47.00 | 57.00 | 93.00 | ... | |
| SUM-DRIVERS | 8.00 | 8.00 | 14.00 | ... | : |
| AVERAGE LOAD | 5.88 | 7.13 | 6.64 | ... | |
| RATIO-LEVEL 4 DRIVERS' LOADS/LOADS | 85.11 | 87.72 | 86.02 | ... | $Y_N$ |
| 4-LEVEL MODIFIED RULE 90 MODEL | | | | | |
| | 1 | 2 | 3 | ... | X |
| LOADS | 40.00 | 50.00 | 80.00 | ... | $Y_0$ |
| FANOUT-LEVEL 1 DRIVER | 1.00 | 1.00 | 1.00 | ... | $Y_1$ |
| FANOUT-LEVEL 2 DRIVER | 1.00 | 1.00 | 1.00 | ... | $Y_2$ |
| FANOUT-LEVEL 3 DRIVER | 2.00 | 2.00 | 4.00 | ... | $Y_3$ |
| FANOUT-LEVEL 4 DRIVER | 20.00 | 25.00 | 20.00 | ... | $Y_4$ |
| LEVEL 1 DRIVERS | 1.00 | 1.00 | 1.00 | ... | $Y_5$ |
| LEVEL 2 DRIVERS | 1.00 | 1.00 | 1.00 | ... | $Y_6$ |
| LEVEL 3 DRIVERS | 1.00 | 1.00 | 1.00 | ... | $Y_7$ |
| LEVEL 4 DRIVERS | 2.00 | 2.00 | 4.00 | ... | $Y_8$ |
| SUM-LEVEL 4 DRIVERS' LOADS | 40.00 | 50.00 | 80.00 | ... | $Y_9$ |
| SUM-LOADS | 44.00 | 54.00 | 86.00 | ... | |
| SUM-DRIVERS | 5.00 | 5.00 | 7.00 | ... | : |
| AVERAGE LOAD | 8.80 | 10.80 | 12.29 | ... | |
| RATIO-LEVEL 4 DRIVERS' LOADS/LOADS | 90.91 | 92.59 | 93.02 | ... | $Y_N$ |

NETWORK DRIVER MODELS

| DRIVER NAME | AREA | $T_R$ | $T_F$ | $T_{RL}$ | $T_{FL}$ | $T_{RR}$ | $T_{FR}$ | $T_{RI}$ | $T_{FI}$ | $C_P$ |
|---|---|---|---|---|---|---|---|---|---|---|
| INV-A | 5880 | 0.254 | 0.119 | 27.756 | 13.092 | 12.118 | 6.787 | 0.701 | 0.187 | 0.008 |
| INV-B | 9800 | 0.089 | 0.052 | 3.897 | 1.692 | 1.818 | 0.840 | 0.186 | 0.191 | 0.048 |
| CLKBUF-1 | 21560 | 0.256 | 0.290 | 0.998 | 0.443 | 0.503 | 0.296 | 0.191 | 0.201 | 0.038 |
| CLKBUF-2 | 15680 | 0.094 | 0.047 | 1.066 | 0.467 | 0.483 | 0.227 | 0.194 | 0.197 | 0.180 |
| CLK | 43120 | 0.400 | 0.397 | 0.413 | 0.402 | 0.279 | 0.291 | 0.181 | 0.213 | 0.048 |

LOAD COMPONENT MODELS

| LOAD NAME | C |
|---|---|
| A | .008 |
| B | .015 |
| C | .035 |
| D | .476 |

DRIVER COMPONENT MODELS

| DRIVER NAME | AREA | $T_R$ | $T_F$ | $T_{RL}$ | $T_{FL}$ | $T_{RR}$ | $T_{FR}$ | $T_{RI}$ | $T_{FI}$ | $C_P$ |
|---|---|---|---|---|---|---|---|---|---|---|
| INV-A | 5880 | 0.254 | 0.119 | 27.756 | 13.092 | 12.118 | 6.787 | 0.701 | 0.187 | 0.008 |
| INV-B | 9800 | 0.089 | 0.052 | 3.897 | 1.692 | 1.818 | 0.840 | 0.186 | 0.191 | 0.048 |
| CLKBUF-1 | 21560 | 0.256 | 0.290 | 0.998 | 0.443 | 0.503 | 0.296 | 0.191 | 0.201 | 0.038 |
| CLKBUF-2 | 15680 | 0.094 | 0.047 | 1.066 | 0.467 | 0.483 | 0.227 | 0.194 | 0.197 | 0.180 |
| CLK | 43120 | 0.400 | 0.397 | 0.413 | 0.402 | 0.279 | 0.291 | 0.181 | 0.213 | 0.048 |

DRIVER COMPONENT MODELS

| WIRELOAD NAME | GATES | LOADS | PART. | CLOCK TREES | L | $R_L$ | $C_L$ |
|---|---|---|---|---|---|---|---|
| E | 200,000 | 12000 | 5 | 2400 | 1523 | .000019 | .000024 |
| F | 200,000 | 12000 | 10 | 1200 | 1077 | .000019 | .000024 |
| G | 200,000 | 12000 | 15 | 800 | 1077 | .000019 | .000024 |
| H | 200,000 | 12000 | 20 | 600 | 761 | .000019 | .000024 |

METHOD FOR DESIGNING A SIGNAL DISTRIBUTION NETWORK

BACKGROUND OF THE INVENTION

The present invention relates, in general, to distributing a signal in a system, and more particularly, to optimizing skew and delay matching of the distributed signal.

A goal in designing system architectures is to distribute a signal to a plurality of locations within the system so that the signal arrives at the various destinations within a specified delay time and having a specified skew. For example, electrical systems include a clock signal distribution network which transmits a clock signal to a plurality of loads within the electrical system. Typically, the clock signal distribution network is designed so that the clock signal is distributed to a plurality of load networks within a specified delay time. In addition, it is designed so that the difference in the arrival times of the clock signal at each load is within a specified time. As those skilled in the art are aware, the difference in arrival times of the clock signal at the various loads is referred to as clock signal skew.

Although conventional techniques used for the design of clock signal distribution networks provides a means for their analysis, design, and implementation, they do not permit simultaneous optimization of parameters such as power, insertion delay, and skew factors. In addition, they mask timing problems until late in the design cycle and do not permit use of multiple clocks external to the portion of the system being floorplanned or placed-and-routed. Further, design constraints such as timing, skew, power, and area are dependent on the particular floorplanning or place-and-route tool being used.

Accordingly, it would be advantageous to have a method for distributing signals in a system that is independent of the particular tool used for designing the system and that can provide signal delay matching between portions of the system having the same or different sizes. It would be of further advantage for the method to be able to account for differences in the components of the signal distribution network and to be implemented early in the system design process.

BRIEF DESCRIPTION OF THE DRAWINGS

FIG. 3 illustrates an example of clocktree architectural models formatted in a form convenient for use in a spreadsheet;

FIG. 4 illustrates a comparison between clocktree architectural models for clock signal distribution networks formatted in a form convenient for use in a spreadsheet;

FIG. 5 illustrates an example of component models formatted in a form convenient for use in a spreadsheet;

DETAILED DESCRIPTION OF THE DRAWINGS

Generally, the present invention provides a method for designing a signal distribution network in a system by using a set of models in conjunction with a set of tools which includes, for example, a spreadsheet, a relational data base, and a graphics plotting package. More particularly, a signal distribution architecture model is combined with a delay model to generate a master model. In addition, sets of data are provided for the parameters of the master model, wherein the sets of data define specific signal distribution architectures. The sets of data are inserted into the master model to determine the optimum signal distribution architecture configuration. It should be understood that a model is merely a physical description of an object or a system.

Figure 1:
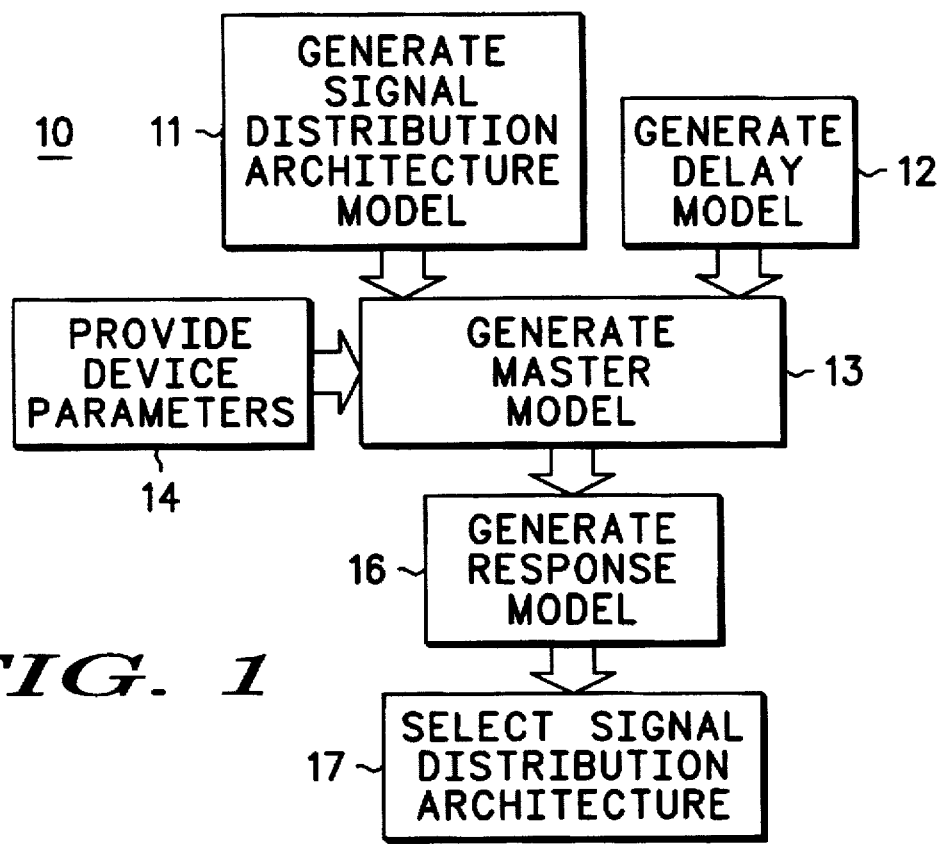
FIG. 1 illustrates a block diagram of a clock signal distribution network designed using a method in accordance with an embodiment of the present invention.

FIG. 1 is a flow diagram 10 of a method for designing a signal distribution network in accordance with an embodiment of the present invention. Briefly and in accordance with the method of the present invention, a signal distribution architecture model and a delay model are generated as indicated by blocks 11 and 12, respectively, of FIG. 1. The signal distribution architecture model is inserted into the delay model to generate a master model (indicated by block 13 of FIG. 1). Sets of device parameters or model parameters are provided to the master model (indicated by block 14) and the master model is simulated to generate a response model (indicated by block 16). It should be understood that a series of sets of device parameters are inserted into the master model, wherein the response of the master model to each set of device parameters forms one element of the response model. A signal distribution architecture is selected in accordance with the desired performance of the signal distribution system and the results from the response model. Selection of the signal distribution architecture is indicted by block 17 of FIG. 1.

By way of example, the signal distribution network is a clock signal distribution network such as a clocktree for an integrated circuit. In accordance with the method of the present invention, a clocktree architecture model is generated (indicated by block 11). For the clocktree, the signal distribution network or clocktree architecture model provides a physical description of the clock signal distribution network. More particularly, the clocktree architecture model provides a description of each component having an affect on the distribution or propagation of the clock signal within the clocktree. As those skilled in the art are aware, components affecting the propagation of the clock signal include the signal source driving the clocktree, the number of driver circuits coupled to the signal source, the number of loads being driven, the loading effects of each driver circuit, and the loading effects of the conductive material interconnecting the signal source, driver circuits, and loads.

Figure 2:
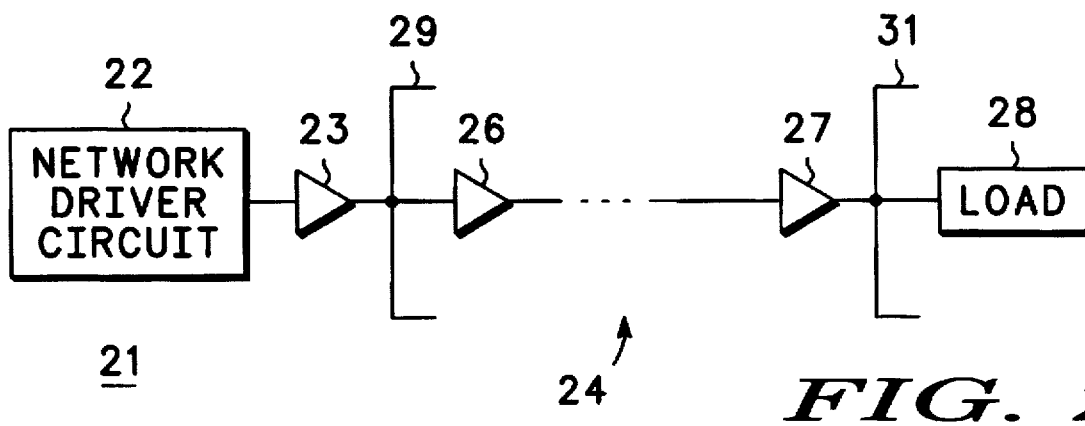
FIG. 2 illustrates a block diagram of an N-level clock signal distribution network designed using a method in accordance with an embodiment of the present invention.

The clock signal distribution network contains a network or source driver circuit which provides the clock signal for the clocktree, at least one driver circuit, and at least one load. The source driver circuit is also referred to as a signal source. An example of a generic clock signal distribution network is illustrated in FIG. 2. What is shown in FIG. 2 is a block diagram of an N-level clock signal distribution network 21 designed using a method in accordance with an embodiment of the present invention. Clock signal distribution network 21 comprises a network driver circuit 22 coupled to a first level driver circuit 23 which is coupled to a load network 24. Load network 24 is comprised of a plurality of coupled driver circuits 26 and 27, and a load 28. The "dotted lines" indicate that each driver circuit 26 and 27 may represent one or more driver circuits. Enlarged bracket 29 serves as a shorthand notation indicating that a plurality of load networks 24 may be connected to driver circuit 23. Likewise, enlarged bracket 31 serves as a shorthand notation indicating that a plurality of loads 28 may be connected to driver circuit 27. The number of levels for an N-level clocktree is determined by the number of driver circuits between network driver circuit 22 and load 28. It should be noted that the number of clock levels for an N-level clock signal distribution network 21 is not a limitation of the present invention. Although not shown, it should be understood that a 1-level clocktree is comprised of network driver circuit 22, driver circuit 23, and at least one load 28.

Referring again to FIG. 1, block 11 refers to modeling a clocktree such as clocktree 21 shown in FIG. 2. For a clocktree such as clocktree 21, the model includes a description of each driver circuit and the loads. At a global level, the model includes a description of the numbers of parameters such as the signal source, the driver circuits, and the loads. In order to determine an optimum clocktree structure, the parameters are placed in a spreadsheet and a plurality of sets of values are assigned to each parameter. In other words, the values for each parameter are varied.

Figure 6:
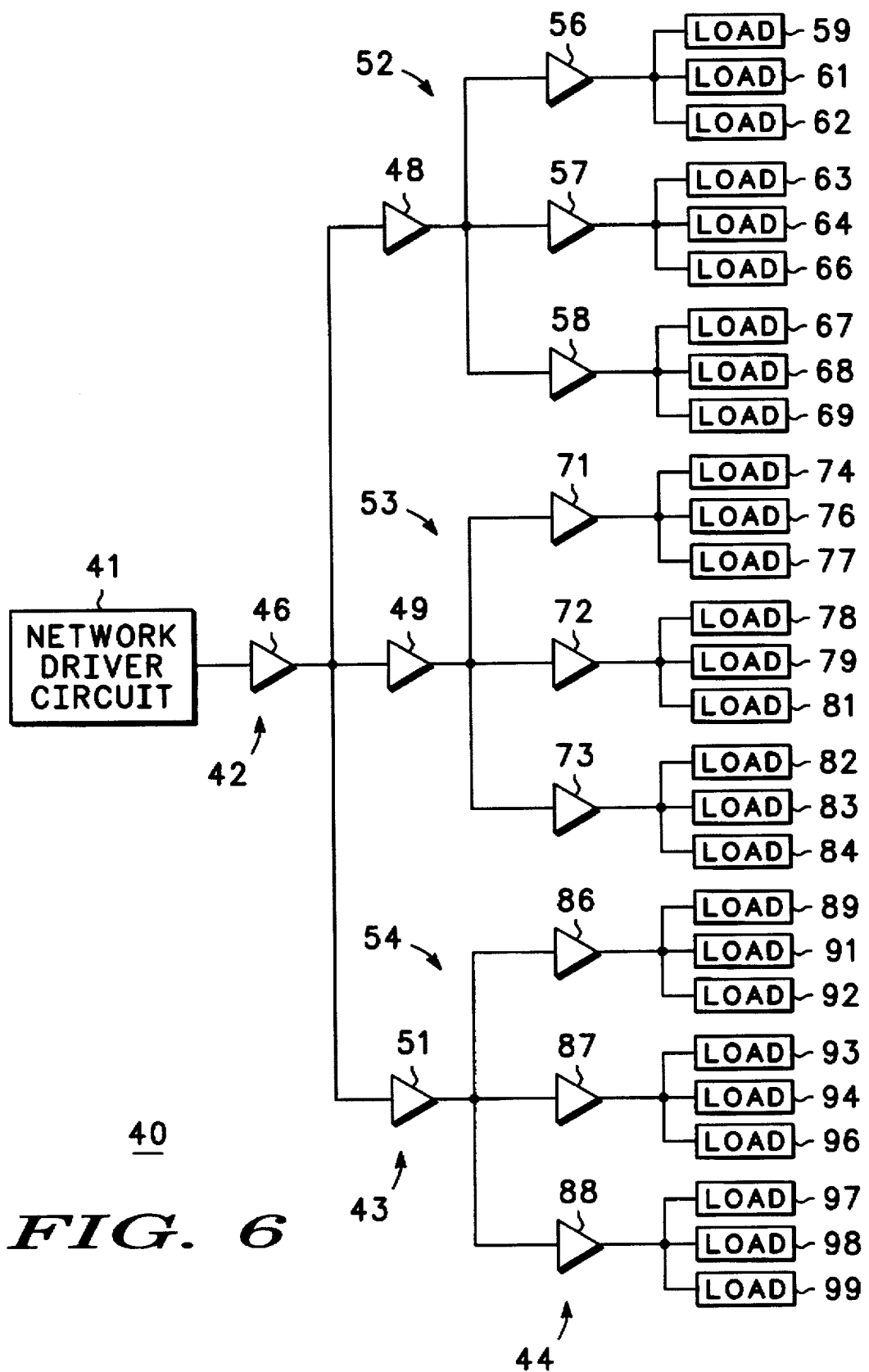
FIG. 6 illustrates a block diagram of a 3-level "SYMMETRICAL" clock signal distribution network designed using a method in accordance with an embodiment of the present invention.
Figure 7:
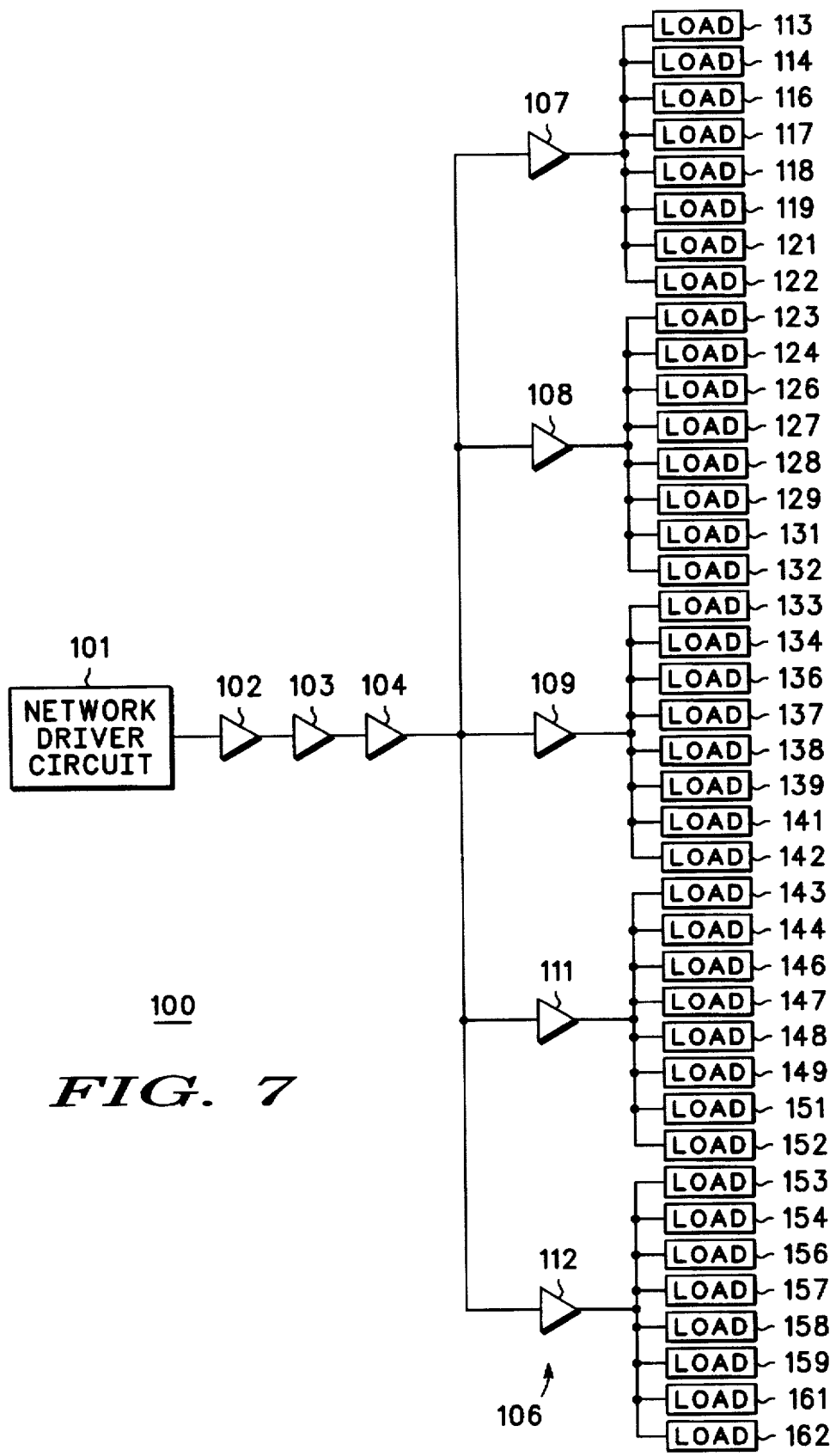
FIG. 7 illustrates a block diagram of a 4-level "RULE-90" clock signal distribution network designed using a method in accordance with an embodiment of the present invention.

The global models can be further defined in terms of the types of driver circuits and loads of the clocktree. In a first global clocktree architecture model, each driver circuit is loaded with the same number of driver circuits and loads according to the $N^{th}$ root of the number of loads driven by the clocktree network, where N is the number of levels of the clocktree. An example of a 3-level clocktree is described and shown with reference to FIG. 6, wherein the 3-level clocktree drives 27 loads. This global clocktree architectural model is also referred to as a "SYMMETRICAL" model. It should be noted that in an ideal "SYMMETRICAL" model, each driver circuit drives the same number of loads or other driver circuits. As those skilled in the art are aware, a driver circuit may be considered as a load. In a second global clocktree architecture model, the ratio between the number of loads in the final level and the number of loads in all the levels is set to 90%. This model is referred to as the "RULE-90" model. An example of a 4-level "RULE-90" model clocktree is shown in FIG. 7. In a third global clocktree architecture model, the number of loads 28 is doubled and the number of load structures 24 is halved when using strong drivers. This model is referred to as the "MODIFIED RULE-90" model. In a fourth global clocktree architecture model, the user defines the number of fanouts per clocktree level. This model is referred to as the "PROTOTYPE" model. It should be noted that the number and types of models are not limitations of the present invention.

FIGS. 3 and 4 illustrate examples of clocktree architectural models formatted in a form convenient for use in spreadsheets 32 and 33, respectively. Each row of spreadsheets 32 and 33 contains a different parameter of the clocktree architectural models and each column of spreadsheets 32 and 33 represents a model for a particular clocktree structure or configuration. In addition, each column represents a possible configuration for the clocktree architecture. As those skilled in the art will understand, the variables X and "Y" represent an integer number that indicate "X" models have from $Y_0$ to $Y_N$ parameters. It should be noted that spreadsheet 32 includes configurations for a 3-level "SYMMETRICAL" configuration and a 4-level "RULE-90" configuration. It should be further noted that spreadsheet 33 is included to show a comparison between models or configurations for a 4-level "RULE-90" configuration and a 4-level "MODIFIED RULE-90" configuration.

In addition, the global model includes component models which model the components of the global model. For example, the signal source models model the output signals of the signal sources in terms of their area, zero-load rise, $T_{RO}$, and fall, $T_{FO}$, edge rates, loaded rise, $T_{RL}$, and fall, $T_{FL}$, edge rates, the intrinsic rising resistance, $R_{RI}$, the intrinsic falling resistance, $R_{FI}$, the capacitance, $C_s$, and the rising, $T_{RS}$, and falling, $T_{FS}$, edge rate sensitivity of the input signals of the signal source. Likewise, the circuit driver models model the circuit drivers' output signals in terms of their zero-load rise, $T_{RO}$, and fall, $T_{FO}$, edge rates, loaded rise, $T_{RL}$, and fall, $T_{FL}$, edge rates, the intrinsic rising resistance, $R_{RI}$, the intrinsic falling resistance, $R_{FI}$, the capacitance, $C_s$, and the rising, $T_{TR}$, and falling, $T_{FC}$, edge rate sensitivity of the input signals of the circuit drivers. Another component model is the wireload model which models the conductive material, e.g., metal or polysilicon traces, connecting the signal source, circuit drivers, and loads. Elements defining the wireload model include the number of gates, loads, clocktrees, the wirelength, L, the wire resistance, $R_L$, and the wire capacitance, $C_L$. It should be noted that in the absence of prior history about the wireload, Bakoglu's method may be used to estimate the wirelength, otherwise, the information is obtained using data from the place-and route-tool. Yet another component model is the load model which models the loads. The loads are modeled as capacitances coupled to the last driver circuit in a signal pathway.

FIG. 4 illustrates example component models formatted in a form convenient for use in a spreadsheet 34. Each row of spreadsheet 34 represents a name for a component and each column of spreadsheet 34 represents the component or element of the particular configuration. For example, in the model for the driver circuits, one type of driver circuit is an inverter, named "INV-A" having a edge rate rise time, $T_R$, of 0.245 nanoseconds (ns), an edge rate fall time, $T_F$, of 0.119 ns, a loaded rise time, $T_{RL}$, of 27.26 ns, a loaded fall time, $T_{FL}$, of 13.09 ns, an intrinsic rise time, $T_{RI}$, of 0.224 ns, a rise edge resistance, $T_{RR}$ of 12.11 kilo-ohms (kΩ), an intrinsic fall time, $T_{IF}$, of 0.12 ns, a falling edge resistance, $T_{FR}$, of 6.79 kΩ, and a pin capacitance, $C_p$, of 0.007732 picofarads (pf). It should be understood that the values for each type of driver circuit have been extracted from the relational data base. It should be noted that the units for the time, resistance, and capacitance values of FIG. 4 are in nanoseconds, kilo-ohms, and picofarads.

Referring again to FIG. 1, a delay model is generated for the signal distribution network (indicated by block 12). The delay model is a description of a system of interacting parameters which describes the temporal relationship of various inputs to the outputs of the signal distribution network. In one example, the delay model for a signal delay path includes a description of the inherent delay of the gate, the transitional delay due to output loading, the edge rate delay due to the ramp time of the input signal, and the connectivity delay from the driver to an input pin. In another example, of a delay equation, the delay model for a signal delay path includes a description of only the inherent delay of the gate and the transitional delay. It should be noted that delay models for signal paths are well known to those skilled in the art.

Numeric values are provided for the elements of each model as indicated by block 14 of FIG. 1. It should be noted that the particular values for the elements of the component models are generated for the specific technology in which the signal distribution architecture is manufactured. For example, the clocktree architecture may be manufactured using bipolar transistor manufacturing processes, complementary metal-oxide-semiconductor transistor manufacturing processes (CMOS), bipolar-metal-oxide semiconductor transistor manufacturing processes, or the like. Techniques for extracting the element values for the component models of, for example, signal sources, driver circuits, and loads, from the manufacturing processes is known to those skilled in the art. The element values may be saved in a relational data base.

A master model is generated by inserting the clocktree architecture model into the delay model (illustrated by block 13 of FIG. 1). A convenient technique for inserting the clocktree architecture model into the delay model is to use a computer. Insertion of a signal distribution architecture model such as, for example, a clocktree architecture model, into the delay model is also referred to as parameterizing the delay model. After parameterization of the delay model, the element values for the model are inserted into the parameterized delay model using, for example, a computer. It should be noted that the element values may be inserted into the clocktree architecture model prior to parameterizing the delay model. Then, the delay model is solved for the particular clocktree architecture model.

An important feature of the present invention is the versatility in using the models to rapidly perform a series of experiments using the global, component, and delay models to determine an optimum clocktree architecture. To illustrate this feature, FIG. 6 shows a 3-level clocktree architecture 41 designed using a method in accordance with a "SYMMETRICAL" model of the present invention. The 3-level clocktree architecture 41 is specified in column 1 of the 3-level "SYMMETRICAL" model shown in spreadsheet 32 of FIG. 3. Clock signal distribution network 40 is a 3-level network comprising first, second, and third levels (or stages) 42, 43, and 44, respectively. First level 42 includes a driver circuit 46 having an input terminal and an output terminal, wherein the input terminal is connected to a network driver circuit 41. Second level 43 includes a plurality of driver circuits 48, 49, and 51 having input terminals and output terminals, wherein the input terminal of each driver circuit 48, 49, and 51 is coupled to the output terminal of driver circuit 46. Third level 44 includes a plurality of sets of driver circuits 52, 53, and 54. The set of driver circuits 52 is comprised of three driver circuits 56, 57, and 58, each having an input terminal and an output terminal, wherein the input terminals of driver circuits 56, 57, and 58 are connected to the output terminal of driver circuit 48. The output terminal of driver circuit 56 is connected to three load structures 59, 61, and 62. The output terminal of driver circuit 57 is connected to three load structures 63, 64, and 66. The output terminal of driver circuit 58 is connected to three load structures 67, 68, and 69. The set of driver circuits 53 is comprised of three driver circuits 71, 72, and 73, each having an input terminal and an output terminal, wherein the input terminals of driver circuits 71, 72, and 73 are connected to the output terminal of driver circuit 49. The output terminal of driver circuit 71 is connected to three load structures 74, 76, and 77. The output terminal of driver circuit 72 is connected to three load structures 78, 79, and 81. The output terminal of driver circuit 73 is connected to three load structures 82, 83, and 84. The set of driver circuits 54 is comprised of three driver circuits 86, 87, and 88, each having an input terminal and an output terminal, wherein the input terminals of driver circuits 86, 87, and 88 are connected to the output terminal of driver circuit 51. The output terminal of driver circuit 86 is connected to three load structures 89, 91, and 92. The output terminal of driver circuit 87 is connected to three load structures 93, 94, and 96. The output terminal of driver circuit 88 is connected to three load structures 97, 98, and 99.

Thus, the values of the appropriate rows and columns of spreadsheets 32 and 33 (shown in FIGS. 3 and 5, respectively) are iteratively inserted into the appropriate portion of the global model which form part of the master model. In addition, the values of the component models are inserted into the master model and the master model is solved for the desired parameter. For example, the master model may be solved for the insertion delay, skew, and power of a particular configuration. The results of each iteration are used to generate a response model. A convenient technique for generating a response model is to enter the results for each iteration in a graphical plotting tool to generate a topology plot. The topology plot illustrates the relationship between, for example, the insertion delay, the skew, and the power. It should be noted that the response model is a three dimensional surface topology plot (not shown) of insertion delay versus skew versus power. Since power is dependent on area, the topology plot also provides an indication of the area consumed by the signal distribution network. It should be understood that the relational parameters, e.g., insertion delay, skew, and power, are not a limitation of the present invention. In other words, the relational parameters are a matter of design choice.

A particular clock architecture model is selected in accordance with the desired results from the topology plot. In other words, the desired output results are selected from the topology plot and architectural model associated with the results is selected for design into the signal distribution architecture To further illustrate the versatility of the present invention, an example of a 4-level clocktree is illustrated in FIG. 7. The 4-level clocktree architecture 100 is specified in column 1 of the 4-level "RULE-90" model shown in spreadsheet 32 of FIG. 3. Clock signal distribution network 100 is a 4-level network comprising first, second, third, and fourth levels (or stages) 102, 103,104 and 106, respectively. First level 102 includes a driver circuit having an input terminal and an output terminal, wherein the input terminal is connected to a network driver circuit 101. Second level 103 includes a driver circuit having an input terminal and an output terminal, wherein the input terminal is coupled to the output terminal of driver circuit 102. Third level 104 includes a driver circuit having an input terminal and an output terminal, wherein the input terminal is coupled to the output terminal of driver circuit 103. Fourth level 106 is comprised of five driver circuits 107, 108, 109, 111, and 112, each having an input terminal and an output terminal, wherein the input terminals of driver circuits 107, 108, 109, 111, and 112 are connected to the output terminal of driver circuit 104. The output terminal of driver circuit 107 is connected to eight load structures 113, 114, 116, 117, 118, 119, 121, and 122. The output terminal of driver circuit 108 is connected to eight load structures 123, 124, 126, 127, 128, 129, 131, and 132. The output terminal of driver circuit 109 is connected to eight load structures 133, 134, 136, 137, 138, 139, 141, and 142. The output terminal of driver circuit 111 is connected to eight load structures 143, 144, 146, 147, 148, 149, 151, and 152. The output terminal of driver circuit 112 is connected to eight load structures 153, 154, 156, 157, 158, 159, 161, and 162.

By now it should be appreciated that a method for designing a portion of a system architecture has been provided. The method permits designing a signal distribution network such as a clocktree by selecting the number and types of buffers in the clocktree and arranging their locations in the clocktree. In addition, the method permits changing the number of loads being driven and the area of the clocktree. The method is independent of the particular tool used for designing the system and accounts for differences in the components in the signal distribution network. Further, the method of the present invention can be implemented early in the system design process, thereby reducing the over design time and design cost.

I claim:

1. A computer implemented method for designing a signal distribution network architecture, comprising the steps of:

generating a signal distribution network architecture model having at least one parameter;

generating a delay model describing a temporal relationship of inputs and corresponding outputs of the signal distribution network architecture;

providing a plurality of sets of values for the at least one parameter of the signal distribution network architecture;

inserting the signal distribution network architecture model into the delay model to generate a master model;

iteratively inserting the plurality of sets of values for the at least one parameter of the signal distribution network architecture model into the delay model to generate a response model; and selecting the signal distribution network architecture model in accordance with the response model, which provides a design for the signal distribution network architecture.

2. The method of claim 1, wherein the step of generating a signal distribution network architecture model includes using an N-level clocktree for the signal distribution network architecture.

3. The method of claim 2, wherein the step of generating a signal distribution network architecture model includes generating a wireload model.

4. The method of claim 3, further including using place-and-route data to generate the wireload model.

5. The method of claim 3, further including using Bakoglu's model to generate the wireload model.

6. The method of claim 2, wherein the step of generating a signal distribution network architecture model includes identifying driver circuits for each level of the N-level clocktree and identifying loads of the N-level clocktree.

7. The method of claim 6, further including the steps of:

storing information in a relational data base; and accessing the information stored in the relational data base using a spreadsheet.

8. The method of claim 7, further including using a graphical plotting package to plot the response model.

9. A computer implemented method for designing a signal distribution network, comprising the steps of:

developing an architectural model for the signal distribution network;

developing a delay model for the signal distribution network; and parameterizing the delay model using the architectural model to form a parameterized delay model.

10. The method of claim 9, wherein the step of developing an architectural model includes developing an architectural model for a clock signal distribution network.

11. The method of claim 10, wherein the step of developing an architectural model includes developing a set of model parameters including driver circuits, load structures, and wireload structures.

12. The method of claim 11, wherein the step of parameterizing the delay model includes providing at least one set of values for the set of model parameters.

13. The method of claim 9, further including the step of using the parameterized delay model to develop a response model.

14. The method of claim 13, further including the step of plotting the response model using a graphics plotting package.

15. The method of claim 14, further including the step of implementing a signal distribution network architecture in accordance with the response model.

16. A method for selecting a clock signal distribution network for an integrated circuit, comprising the steps of:

developing a clock signal distribution architecture model for the integrated circuit;

developing a delay model comprising at least one variable, which describes a temporal relationship of inputs and corresponding outputs of the clock signal distribution network;

providing a set of values for the clock signal distribution architecture model;

combining the clock signal distribution architecture model with the delay model to form a master model;

inserting the set of values for the clock signal distribution architecture model into the master model; and generating a response model.

17. The method of claim 16, further including the step of using the response model to select a clock signal distribution network architecture.

18. The method of claim 16, further including developing the clock signal distribution model for an N-level clocktree.

19. The method of claim 16, wherein the step of developing a clock signal distribution architecture model includes providing parameters for circuit drivers, load structures, and wireloads.

20. The method of claim 19, wherein the step of providing a set of values for the clock signal distribution architecture model includes providing values at least for rise and fall times at inputs and outputs of circuit drivers and capacitances at inputs to the circuit drivers.

* * * * *